United States Patent
Dao

(10) Patent No.: US 7,387,946 B2
(45) Date of Patent: Jun. 17, 2008

(54) METHOD OF FABRICATING A SUBSTRATE FOR A PLANAR, DOUBLE-GATED, TRANSISTOR PROCESS

(75) Inventor: Thuy Dao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 337 days.

(21) Appl. No.: 11/146,825

(22) Filed: Jun. 7, 2005

(65) Prior Publication Data

US 2006/0276004 A1    Dec. 7, 2006

(51) Int. Cl.
*H01L 21/461* (2006.01)

(52) U.S. Cl. ............ 438/458; 438/459; 438/798; 257/E21.6

(58) Field of Classification Search ........... 438/475, 438/798; 257/E21.6
See application file for complete search history.

(56) References Cited

U.S. PATENT DOCUMENTS

| | | | |
|---|---|---|---|
| 6,191,007 B1 * | 2/2001 | Matsui et al. | 438/459 |
| 6,727,549 B1 * | 4/2004 | Doyle | 257/347 |
| 2001/0014516 A1 * | 8/2001 | Shimoji | 438/458 |
| 2002/0090758 A1 * | 7/2002 | Henley et al. | 438/110 |
| 2002/0145140 A1 * | 10/2002 | Katayama | 257/59 |
| 2004/0063298 A1 | 4/2004 | Aga et al. | |
| 2004/0087075 A1 * | 5/2004 | Wang et al. | 438/199 |
| 2004/0175902 A1 * | 9/2004 | Rayssac et al. | 438/459 |
| 2006/0172467 A1 * | 8/2006 | Lee et al. | 438/149 |

OTHER PUBLICATIONS

C. Maleville et al., Multiple SOI layers by multiple Smart-Cut transfers, 2000 IEEE International SOI Conference, Oct. 2000, pp. 134-135.

I. Aberg et al., Fabrication of Strained Si/Strained SiGe/Strained Si Heterostructures on Insulator by a bond and etch-back technique, 2004 IEEE Int'l SOI Conference, Oct. 2004, pp. 35-36.

* cited by examiner

*Primary Examiner*—Stephen W Smoot

(57) ABSTRACT

A semiconductor fabrication process includes forming a sacrificial layer on a substrate of a donor wafer and implanting hydrogen ions into the substrate through the sacrificial layer to create a stress layer in the substrate. After forming the stress layer, multiple layer stacks are formed on the donor wafer substrate including a bottom gate conductor layer and a bottom gate dielectric layer. An upper surface of the donor wafer is bonded to an upper surface of a handle wafer. An oxide or low-k layer may be formed on the handle wafer. A portion of the substrate of the donor wafer is then cleaved. The bottom gate conductor layer is selected from the group including polysilicon, alpha silicon, alpha germanium, W, Ti, Ta, TiN, and TaSiN.

6 Claims, 2 Drawing Sheets

METHOD OF FABRICATING A SUBSTRATE FOR A PLANAR, DOUBLE-GATED, TRANSISTOR PROCESS

RELATED APPLICATION

The subject matter disclosed herein is related to the subject matter disclosed in U.S. patent application Ser. No. 10/871,402 entitled Method of Forming a Transistor with a Bottom Gate by Thuy Dao, filed Jun. 18, 2004, (the "Related Application"), which is incorporated by reference herein in its entirety.

FIELD OF THE INVENTION

The invention is in the field of semiconductor fabrication processes and more particularly fabrication processes that employ planar, double-gated (DG) transistors.

RELATED ART

The Related Application teaches a process for fabricating fully depleted (FD) planar DG transistors on a semiconductor on insulator (SOI) substrate. The present disclosure extends the teachings of the Related Application by disclosing expanded techniques for preparing a starting material suitable for use in the fabrication of FD planar DG transistors.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Disclosed is a method of fabricating a device wafer suitable for use in a process that employs planar, double-gated transistors. A dielectric layer and possible other layers are formed overlying a semiconductor substrate of a handle wafer. A donor wafer is processed by forming a sacrificial dielectric layer overlying a substrate of the donor wafer. The donor wafer is subjected to an implant to introduce a stress layer into the donor wafer substrate. The sacrificial dielectric is then removed and a dielectric/gate stack formed on the donor wafer. The donor wafer is then "flipped" relative to the handle wafer bonded or otherwise attached to the handle wafer. After bonding, the donor wafer is cleaved along the stress layer to remove a portion of the donor wafer substrate and thereby form the desired device wafer from which the DG transistors are fabricated. By performing the stress layer implant prior to forming the donor wafer dielectric stack, the invention enables the use of alternative donor wafer dielectric/gate stack materials without regard to the effect of the stress layer implant. The device wafer includes a bottom gate conductor layer underlying a bottom gate dielectric underlying a channel region. The channel region may be monocrystalline or strained crystalline silicon.

Figure 1:
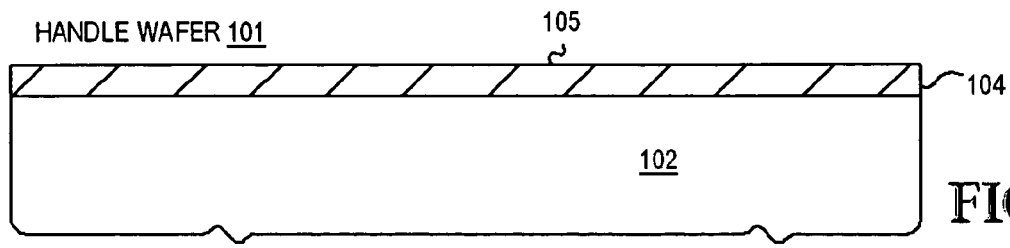
FIG. 1 is a cross sectional view of a handle wafer including a handle wafer stack overlying a substrate according to the present invention.

Referring now to the drawings, FIG. 1 is a partial cross sectional view of a first wafer, referred to herein as a handle wafer 101. Handle wafer 101 includes a semiconductor substrate 102 and a handle wafer stack 104. In one implementation, substrate 102 is a crystalline semiconductor such as silicon, silicon germanium, or various III-V compound semiconductors such as gallium arsenide. In other implementations, substrate 102 may include a thermally conductive, electrically insulating film such as aluminum oxide, silicon boron nitride, and other suitable thermally conductive insulators.

The handle wafer stack 104 in one implementation is deposited or thermally formed silicon oxide. In another embodiment, handle wafer stack 104 is a low-k dielectric (a dielectric having a dielectric constant less than approximately 3.0), such as a spin deposited polymer or an organic-inorganic hybrid.

Figure 2:
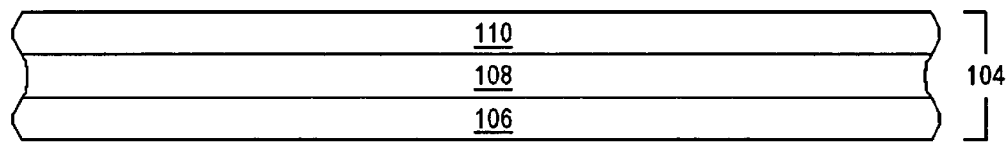
FIG. 2 illustrates additional detail of the handle wafer stack of FIG. 1.

In other embodiments, handle wafer stack 104 may include multiple layers of different materials. In an embodiment emphasized in FIG. 2, handle wafer stack 104 includes a silicon oxide or low-k dielectric layer 106, an electrically conductive noise reduction plane 108, and a thermally conductive, electrical insulator layer 110. In this embodiment, the noise reduction plane 108 may be a conventional heavily doped polysilicon layer. Contacts to this layer 108 may be made using vias (not depicted) through electrical insulator layer 110. In still other embodiments, handle wafer 101 does not include a handle wafer stack 104. In these embodiments, the substrate 102 of handle wafer 101 is bonded directly to a donor wafer (described below).

Figure 3:
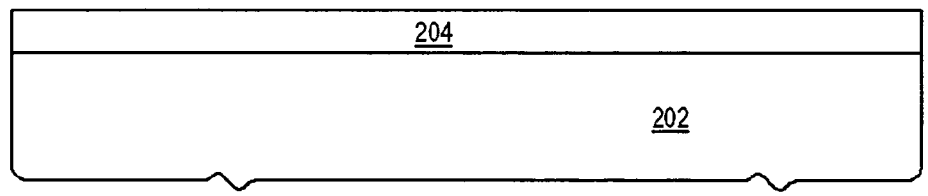
FIG. 3 is a cross sectional view of a donor wafer including a sacrificial layer overlying a substrate according to the present invention.

Referring now to FIG. 3, a donor wafer 201 is shown in cross section. Donor wafer 201 includes a substrate 202 upon which a sacrificial layer 204 has been formed. In one embodiment, substrate 202 is made of monocrystalline silicon, but in other embodiments, may be made of strained silicon or other types of semiconductor materials such as silicon carbon, silicon germanium, germanium, type III-V semiconductor materials, type II-VI semiconductor materials, and combinations thereof including multiple layers of different semiconductor materials. In some embodiments, semiconductor material in substrate 202 may be strained.

Figure 4:
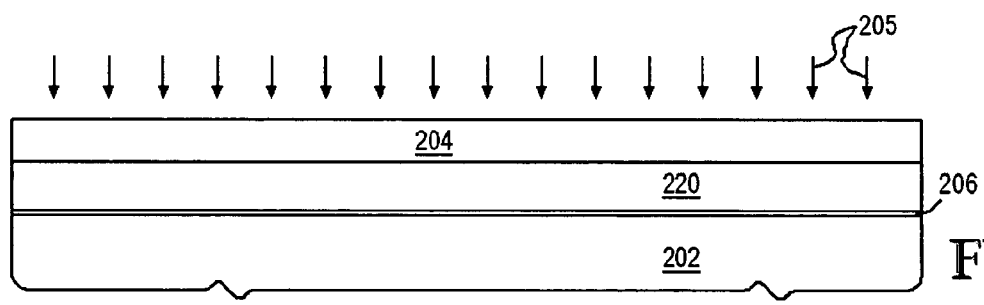
FIG. 4 illustrates forming a stress layer in the substrate of the donor wafer of FIG. 3 according to the present invention.
Figure 5:
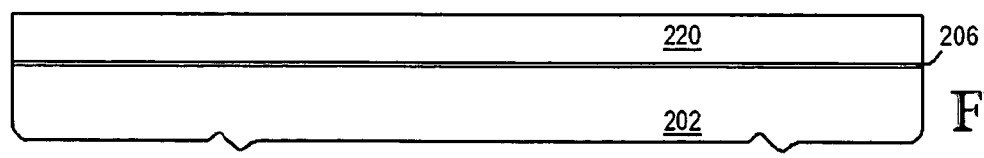
FIG. 5 illustrates processing of the donor wafer subsequent to FIG. 4 including removing the sacrificial layer according to the present invention.

Sacrificial layer 204 is a deposited or thermally formed silicon oxide in one embodiment. In other embodiments, sacrificial layer 204 is a "soft" dielectric layer such as a polymer-based dielectric or a spin-on dielectric. Following the formation of sacrificial layer 204, a stress layer 206 is formed in substrate 202 as shown in FIG. 4. Formation of stress layer 204 is preferably achieved by an ion implant process represented by reference numeral 205. In the preferred embodiment, hydrogen or oxygen ions are used as an implant species to form stress layer 206. Following the formation of stress layer 206, sacrificial layer 204 is removed as shown in FIG. 5 to expose a semiconductor surface of donor wafer 201. The portion 220 of donor wafer 201 lying above stress layer 206 will be used to provide a channel region for a planar double gate transistor while remainder of substrate 202 will be reused or discarded.

Figure 6:
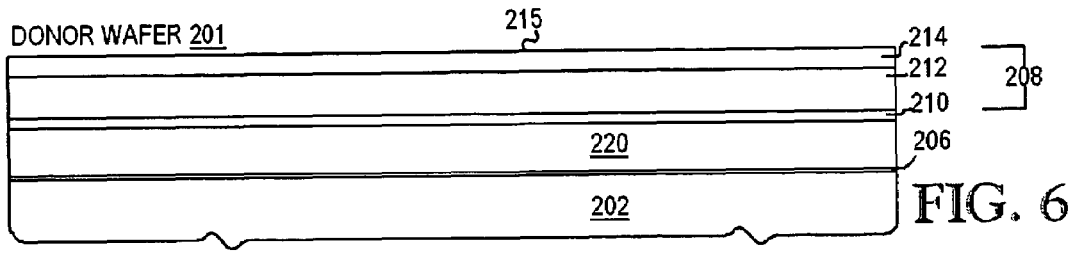
FIG. 6 illustrates processing of the donor wafer subsequent to FIG. 5 including forming a bottom gate/dielectric stack according to the present invention.

Referring to FIG. 6, processing of donor wafer 201 continues with the formation of a bottom dielectric/gate stack 208. In the depicted embodiment, bottom dielectric/gate stack 208 includes a layer 214 to facilitate bonding with handle wafer 101, a layer 212 to serve as a "bottom" gate conductor layer, and a layer 210 to serve as the bottom gate dielectric. Bottom gate dielectric layer 210 may be a thermally formed silicon dioxide, a high-k material, a deposited oxide, or the like.

The bottom gate conductor layer 212 may be polysilicon, α-silicon, α-germanium, tungsten, titanium, tantalum, titanium nitride, tantalum silicon nitride, or another suitable conductive film. Insulating layer 214 of FIG. 6 is an optional layer. Insulating layer 214, when used, is preferably a conventional deposited oxide layer (e.g., TEOS-based oxide layer) or a "soft" dielectric layer suitable for facilitating the formation of a wafer bond between the two wafers.

Figure 7:
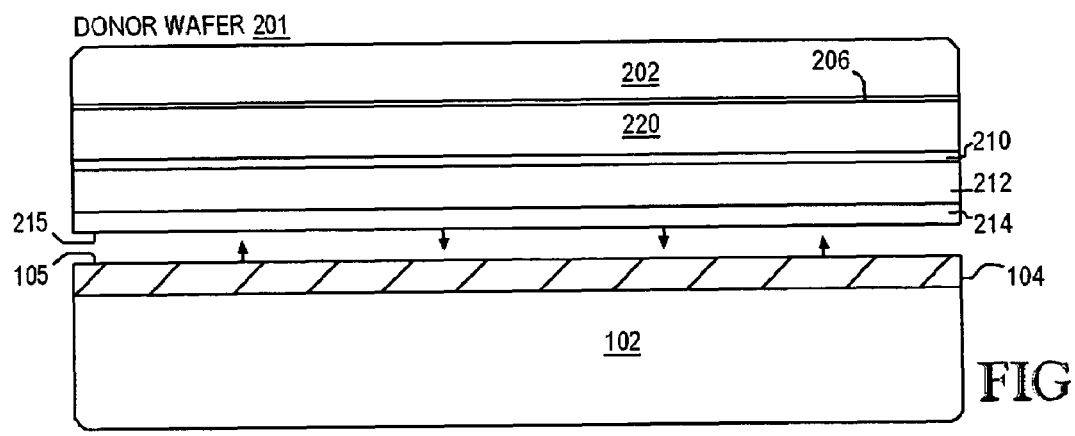
FIG. 7 illustrates bonding of the donor wafer to the handle wafer according to the present invention to produce a device wafer.

Referring now to FIG. 7, upper surface 215 of donor wafer 201 is bonded to upper surface 105 of handle wafer 101 to form a device wafer 200 suitable for fabricating a transistor having a bottom gate such as a double gated transistor. Bonding donor wafer 201 and handle wafer 101 may include bonding to an insulator in layer 104 with a bonding material. In other embodiments, handle wafer 101 may be bonded to donor wafer 201 using other bonding techniques such as electrostatic bonding followed by thermal bonding or pressure bonding.

Figure 8:
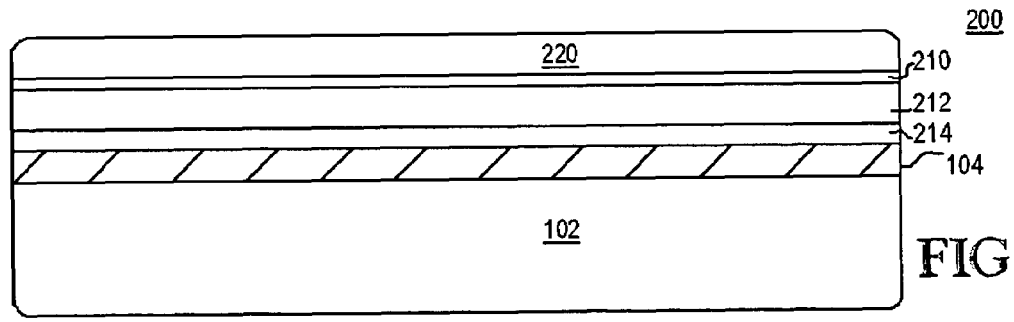
FIG. 8 depicts processing of the device wafer subsequent to FIG. 7 in which the donor wafer substrate is cleaved along the stress layer according to the present invention.

In FIG. 8, a portion of the substrate 202 of donor wafer 201 is removed. Specifically, the portion of substrate 202 lying below stress layer 206 (when upper surface 215 is facing upward) is removed. In one embodiment, this portion of substrate 202 is removed by cleaving donor wafer 201 along stress layer 206, which greatly facilitates the cleaving processing by creating random, but localized disorders in the crystalline structure. Removing this portion of substrate 202 leaves device wafer 200 with a strained or crystalline semiconductor layer 220 overlying a bottom gate dielectric 210 overlying a bottom gate electrode layer 212. Bottom gate conductor layer 212 may overlie a buried dielectric layer that may or may not include insulating layer 214 of donor wafer 201 and a dielectric layer in handle wafer stack 104. In the depicted embodiment, insulating layer 214 lies over handle wafer stack 104, which may be an oxide layer or a multiple layer structure as described above with respect to FIG. 1 and FIG. 2. Finally, handle wafer stack 104 overlies the handle wafer substrate 102.

Figure 9:
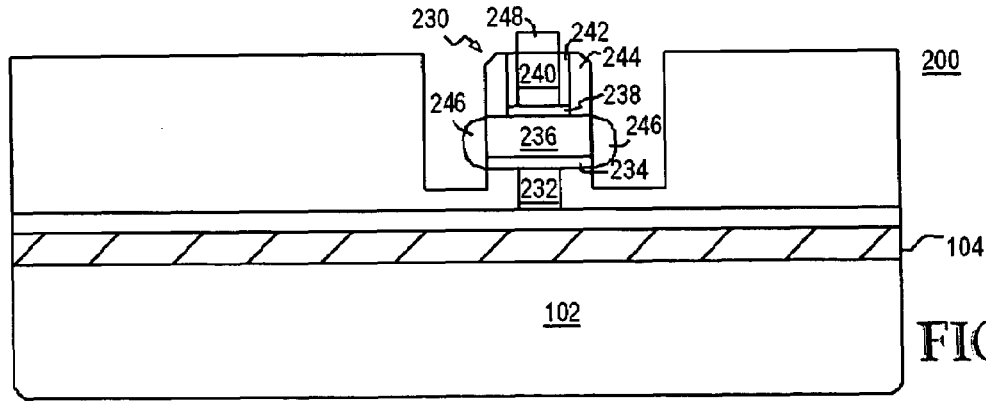
FIG. 9 depicts processing of the device wafer subsequent to FIG. 8 in which a transistor is fabricated in the device wafer.

In FIG. 9, subsequent processing (such as the processing described in the Related Application) on device wafer 200 depicted in FIG. 8 produces a planar, double gate transistor 230. Transistor 230 includes a bottom gate electrode 232 contacting a bottom gate dielectric 234. A channel region 236 overlies bottom gate dielectric 234 and bottom gate electrode 232. A top gate dielectric 238 is formed overlying transistor channel region 236 and a top gate electrode 240 formed on second gate dielectric 238. Insulating spacers 242 and 244 are formed on sidewalls of top gate electrode 240. Conductive source/drain structures 246 are in contact with opposing edges of channel region 236. A cap layer 248 protects top gate conductor 240. In the embodiment depicted in FIG. 9, bottom gate electrode 232 represents a remaining portion of bottom gate conductor layer 212 (FIG. 8) and bottom gate dielectric 234 represents a portion of dielectric film 210. In the preferred embodiment, transistor 230 is a fully depleted transistor where the depletion region between gate electrodes 232 and 240 extends from bottom gate dielectric 234 to top gate dielectric 238 when a threshold voltage is applied to the gate electrodes.

In the foregoing specification, the invention has been described with reference to specific embodiments. However, one of ordinary skill in the art appreciates that various modifications and changes can be made without departing from the scope of the present invention as set forth in the claims below. For example, the disclosed process makes no assumption about the conductivity types (p-doped or n-doped) and it is understood that the disclosed process and structures may be implemented with PMOS or NMOS transistor. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of forming a planar, double gate transistor includes:
    implanting hydrogen into a substrate of a donor wafer to form a stress layer in the substrate;
    after implanting the hydrogen, forming a stack of layers on the donor wafer, the stack including a bottom gate conductor layer and a bottom gate dielectric;
    bonding the donor wafer to a handle wafer;
    removing a portion of the donor wafer to produce a device wafer; and
    forming the transistor in the device wafer.

2. The method of claim 1, further comprising, prior to implanting the hydrogen, forming a sacrificial oxide.

3. The method of claim 2, further wherein the stack includes an oxide layer overlying the bottom gate conductor layer.

4. The method of claim 3, wherein removing the donor wafer portion comprises cleaving the donor wafer substrate along a line defined by the stress layer.

5. The method of claim 4, wherein the handle wafer includes a conductive plane for noise reduction.

6. The method of claim 5, wherein the handle wafer further includes an electric insulator.

* * * * *